United States Patent [19]

Takemoto

[11] Patent Number: 4,929,815
[45] Date of Patent: May 29, 1990

[54] HEATING RESISTOR DRIVING CIRCUIT WHICH SUPPRESSES CURRENT SPIKES

[75] Inventor: Satoru Takemoto, Kanagawa, Japan

[73] Assignee: Fuji Photo Film Co., Ltd., Kanagawa, Japan

[21] Appl. No.: 340,733

[22] Filed: Apr. 20, 1989

[30] Foreign Application Priority Data

Apr. 20, 1988 [JP] Japan .................................. 63-97469

[51] Int. Cl.⁵ .................................................. H05B 1/02
[52] U.S. Cl. ..................................... 219/501; 219/209; 219/497; 361/101; 361/111; 307/117
[58] Field of Search ............... 219/494, 501, 209, 210, 219/457, 499, 506; 361/101, 111, 118; 307/117

[56] References Cited

U.S. PATENT DOCUMENTS

| | | | |
|---|---|---|---|
| 3,819,952 | 6/1974 | Enomoto et al. | 361/111 |
| 3,838,248 | 9/1974 | Uchida et al. | 219/210 |
| 3,962,559 | 6/1976 | Drda et al. | 219/210 |
| 4,057,844 | 11/1977 | Smedley | 361/111 |
| 4,449,032 | 5/1984 | Frerking | 219/210 |
| 4,484,244 | 11/1984 | Avery | 361/111 |
| 4,678,950 | 7/1987 | Mitake | 361/111 |
| 4,712,152 | 12/1987 | Iio | 361/111 |

*Primary Examiner*—M. H. Paschall
*Attorney, Agent, or Firm*—Sughrue, Mion, Zinn, Macpeak & Seas

[57] ABSTRACT

A heating resistor drive circuit includes a first switching transistor, connected in series to the resistor, for connecting and cutting off a current flow supplied from a power source to the heating resistor, and a second switching transistor connected in series to the base of the first transistor. The second transistor is turned on in response to an actuation signal. The drive circuit further includes a suppressing circuit for raising gradually a base current for the first transistor up to a predetermined level while the second transistor is conductive, so as to suppress a current spike flowing through the heating resistor.

3 Claims, 2 Drawing Sheets

HEATING RESISTOR DRIVING CIRCUIT WHICH SUPPRESSES CURRENT SPIKES

BACKGROUND OF THE INVENTION

The present invention relates to a circuit for driving a heating resistor of a lamp, a heater or the like, and more particularly to a heating resistor driving circuit in which current surge is prevented from flowing through the heating resistor at the beginning of heating.

Excitation or driving of heating resistors is started by turning on a switch connected in series to the heating resistor. Such a heating resistor usually has a relatively low resistance which increases as heat is generated. In particular, immediately after the turning on of the switch (SW), a relatively high current spike (IL), such as shown in FIG. 4, tends to flow through the resistor.

Current spiking causes a drop of working voltage of a power source, resulting in operational errors of circuits, such as operational circuits, actuated by the power source. Instruments or devices including a large capacity power source to prevent the occurrence of current spiking can be bulky. To prevent effectively the occurrence of current spiking, the heating resistor has been preheated with a small amount of current. However, this approach has resulted in large power consumption.

SUMMARY OF THE INVENTION

Therefore, it is a primary object of the present invention to provide a heating resistor driving circuit in which suppressed current surge is applied to the heating resistor at the beginning of heating.

The above object of the present invention is achieved by a drive circuit, for heating a resistor element, consisting of a first switching transistor, connected in series with the resistor element, for connecting and cutting off a current flow supplied from a power source to the heating resistor, and a second switching transistor, connected in series to the base of the first transistor, which is made conductive in response to an actuation signal. The drive circuit further consists of suppressing circuitry for raising gradually a base current for the first transistor up to a predetermined level while the second transistor is conductive, so as to suppress a current spike through the heating resistor element.

According to a preferred embodiment of the present invention, the suppressing circuitry comprises a resistor connected between the emitter of the first transistor and a terminal of the power source, a third transistor whose collector is connected between the resistor and the power source terminal and whose emitter is connected to the base of the first transistor, and a capacitor connected between the base of the third transistor and the power source terminal.

When driving the heating resistor element, an actuation signal is applied to the base of the second transistor to turn it on. This causes the third transistor of the suppressing circuitry to control a base current for the first transistor so as not to allow a rapid flow of current through the first transistor (and hence through the heating resistor element), but rather to cause a gradual increase in current therethrough to a predetermined level. This prevents the heating resistor element from being subjected to a current spike when the resistance of the heating resistor element still is small at the beginning of excitation or driving thereof. As the heating resistor element heats and increases its resistance, the drive circuit causes a gradual increase of current flow through the first transistor (and hence through the heating resistor element), sufficient to make the heating resistor element produce a sufficient amount of radiation.

BRIEF DESCRIPTION OF THE DRAWINGS

The above and other objects of the present invention will be apparent from the following description by way of a preferred embodiment thereof with reference to the accompanying drawings, wherein.

DETAILED DESCRIPTION OF THE PREFERRED EMBODIMENT

Figure 1:
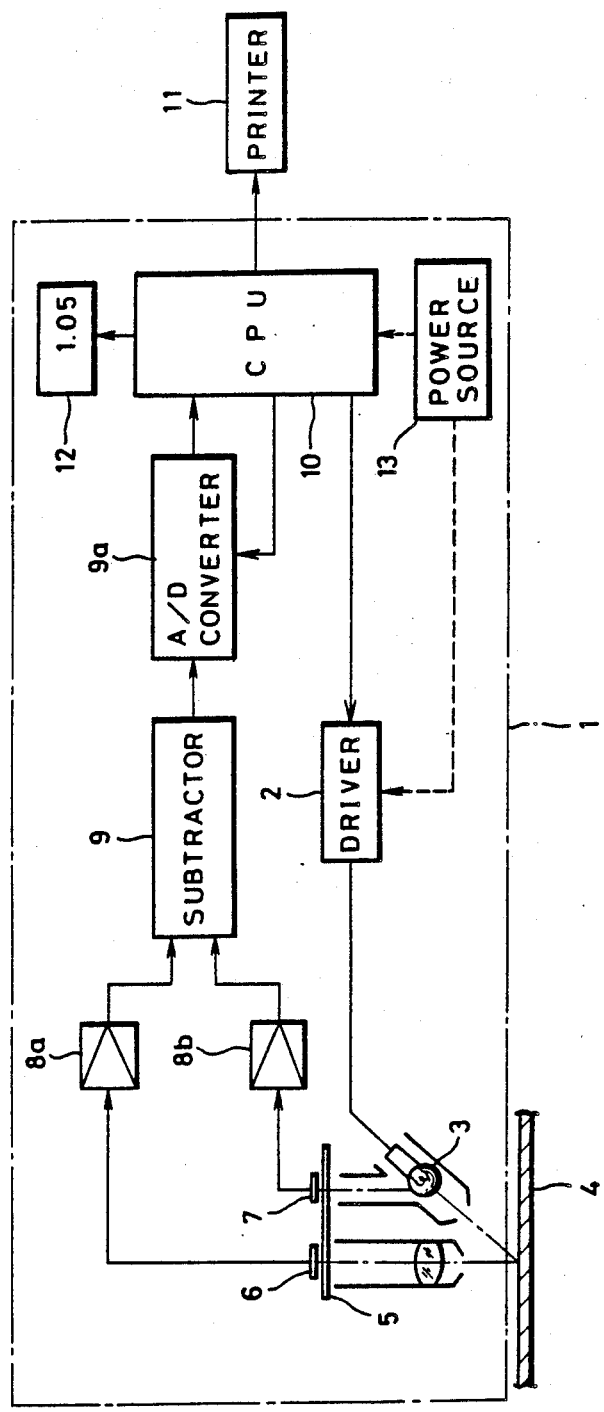
FIG. 1 is a schematic block diagram illustrating a densitometer in which the present invention is embodied.

Referring now to the drawings, and in particular to FIG. 1, a photographic densitometer 1 having a heating resistor driving circuit in accordance with a preferred embodiment of the present invention is shown, comprising a lamp 3 having a heating element excited or driven by a driver circuit 2 to illuminate a subject 4 such as a negative film to be measured. A photodetector 6 detects the light reflected from the subject 4 as a subject light, and a photodetector 7 detects part of the light emitting from the lamp 3 as a reference light. The subject light and reference light are received by respective photodetectors 6 and 7 through a filter 5. Each photodetector 6, 7 provides an amplifier 8a, 8b, respectively, with a photoelectric output representing or proportional to the amount of light received thereby. Each amplifier 8a, 8b transforms the photoelectric output into a logarithm.

A subtractor or subtraction circuit 9 is connected to the amplifiers 8a and 8b to obtain the difference of the logarithmic outputs from the amplifiers 8a and 8b as a density signal. A central processing unit (CPU) 10 computes a mean density of the subject 4 and sends a mean density signal to a printer 11 for controlling an exposure and to a display 12 for indicating a digital density. A power source 13 commonly is used to excite or drive the lamp 3 by way of the driver 2 and to actuate electric operated elements of the densitometer 1.

Figure 2:
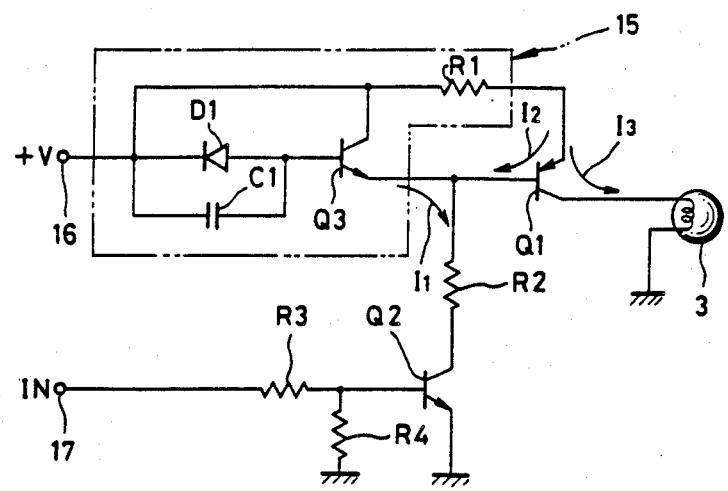
FIG. 2 is a circuit diagram showing a drive circuit for a heating resistor element in accordance with a preferred embodiment of the present invention.

The driver 2, which is illustrated in detail in FIG. 2, consists of a first transistor Q1 having its collector connected to the lamp 3 in series, a second transistor Q2 having its collector connected to the base of the first transistor Q1 in series, and a circuit 15 for suppressing an amount of base current flowing to the first transistor Q1. The second transistor Q2 turns on in response to an actuation signal IN appearing at the base thereof through an input terminal 17 of the drive circuit 2. When the second transistor turns on, the suppressing circuit 15 is actuated to amplify a base current for the first transistor up to a predetermined level.

The suppressing circuit 15 consists of a resistor R1 connected between the emitter of the first transistor Q1 and one terminal 16 of the power source 13, a third transistor Q3 having its collector connected to a line between the resistor R1 and the terminal 16 of the power source 13 and its emitter connected to the base of the first transistor Q1, and a capacitor C1 connected between the base of the third transistor Q3 and the terminal 16 of the power source 13. The resistor R1 preferably has a small resistance of around 0.2 ohms so as to prevent the first and third transistors Q1 and Q2 from turning on simultaneously.

A diode D1, which is connected between the base of the third transistor Q3 and the terminal 16 of the power source 13 in parallel to the capacitor C1, is incorporated in the suppressing circuit 15 to protect the transistor Q2. A resistor R2 is connected between the collector of the second transistor Q2 and the junction of the base of the first transistor Q1 and the emitter of the third transistor Q3. The drive circuit 2 further is provided with a resistor R3, connected to the base of the second transistor Q2 and an input terminal 17 of the driver circuit 2, and a resistor R4, connected between a junction of the base of the second transistor Q2 and the resistor R3 and ground.

Figure 3:
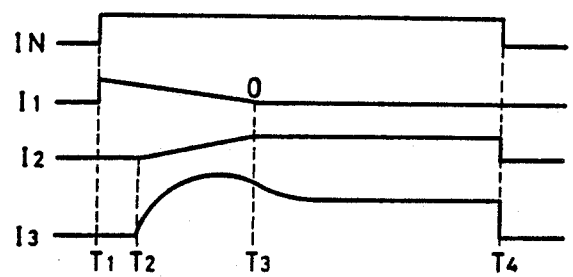
FIG. 3 is a timing chart illustrating changes of current flows in the drive circuit shown in FIG. 1.
Figure 4:
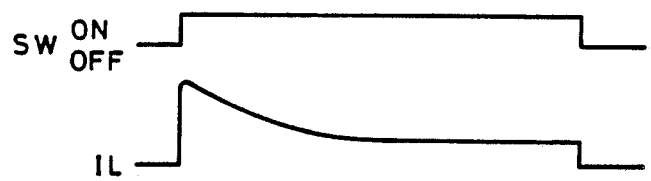
FIG. 4 is a graph showing current spiking.

The operation of the drive circuit 2 will be understood best by referring to a timing chart illustrated in FIG. 3. At a time $T_1$, if the actuation signal IN in the form of voltage at the input terminal 17 is at a high level (H), it is divided into two equal parts by the voltage divider comprising the transistors R3 and R4. One half of the divided voltage is applied to the base of the second transistor Q2 to turn it on.

The turning on of the second transistor Q2 causes the third transistor Q3 to turn on. However, because of the resistor R1 connected to the emitter of the first transistor Q1, the first transistor Q1 is kept nonconductive, preventing a current $I_3$, which is necessary to drive the heating element of the lamp 3, from flowing across the collector and emitter of the first transistor Q1, so that the heating element of the lamp 3 does not emit radiation.

As the capacitor C1 is charged, a current applied to the base of the third transistor Q3 drops. This causes a drop of current appearing at the collector of the third transistor Q3, resulting in a drop of current $I_1$ appearing at the emitter of the third transistor Q3. At a time $T_2$, the emitter current $I_1$ of the third transistor Q3 drops below a predetermined level to turn the first transistor Q1 on, allowing the current $I_3$ to flow to the heating element of the lamp 3, whereby the lamp 3 lights. A current $I_2$ appearing at the base of the first transistor Q1 increases in inverse proportion to the drop of the emitter current $I_1$ of the third transistor Q3. Accordingly, the current $I_3$ flowing through the heating element of the lamp 3, which is the collector current of the first transistor Q1, will gradually increase. The brighter the lamp 3 becomes, the larger the collector current $I_3$ of the first transistor Q1 becomes. This prevents a current spike from flowing to the heating element of the lamp 3 at the beginning of driving the heating element of the lamp 3, when a resistance of the heating element of the lamp 3 is small.

At a time $T_3$, the capacitor C1 connected to the base of the third transistor Q3 is charged and saturates, resulting in a voltage drop at the base of the third transistor Q3. This causes the third transistor Q3 to turn off. As a result, the suppression of the base current $I_2$ of the first transistor Q1 is discontinued, maintaining the first transistor Q1 conductive so as to allow a constant value of operating current $I_3$, for example one ampere (1A), to flow through the lamp 3. Before the operating current $I_3$ becomes constant, the heating element of the lamp 3 will have heated sufficiently to increase its resistance. Therefore, it is possible to suppress the current spike to around two amperes (2A) at the beginning of driving the heating element of the lamp 3, causing no voltage drop necessary for the operational circuit of the densitometer 1 to operate effectively, so that the operational circuit of the densitometer 1 is prevented from improperly operating or causing operational errors.

As described above, an occurrence of current spiking which causes a drop of working voltage of a power source is prevented, so that no operational error occurs in the electric operated circuits driven with the common power source to the heating resistor drive circuit because a current spike is prevented from flowing through the heating resistor.

Any circuit which can suppress a base current for the first resistor Q1 may be incorporated in the drive circuit in place of the suppressing circuit 15, which includes the third transistor Q3, the capacitor C1 connected to the base of the third transistor Q3, and the small resistor R1 disposed between the base of the first transistor Q1 and the power source.

The drive circuit of the present invention need not be embodied exclusively in exciting or driving an illumination lamp of a photographic densitometer, but may be employed in any instrument or apparatus having a heating resistor element.

Although the present invention has been fully described by way of the preferred embodiment thereof with reference to the accompanying drawings, various changes and modifications will be apparent to those of working skill in this technological field. Therefore, unless such changes and modifications depart from the scope and spirit of the present invention, they should be construed as included therein, particularly with reference to the appended claims.

What is claimed is:

1. A drive circuit for a heating resistor element, comprising:
    a first transistor having first, second, and third terminals, said first terminal being connected in series to said heating resistor element relative to a power source terminal;
    a second transistor having first, second, and third terminals, said first terminal of said second transistor being connected in series to said second terminal of said first transistor, said second transistor being turned on in response to an actuating signal; and
    suppression means, responsive to a conductive state of said second transistor, for raising gradually a base current of said first transistor to a predetermined level, so as to suppress a current spike through the heating resistor element at a beginning of driving said heating resistor element.

2. A drive circuit as defined in claim 1, wherein said suppression means comprises:
    a resistor connected between said third terminal of said first transistor and said power source terminal;
    a third transistor having first, second, and third terminals, said first terminal being connected between said resistor and said power source terminal and said third terminal being connected to said first terminal of said first transistor; and
    a capacitor connected between said second terminal of said third transistor and said power source terminal.

3. A drive circuit as defined in claim 1, wherein said first, second, and third terminals of each of said first, second, and third transistors are a collector, a base, and an emitter, respectively.

* * * * *